United States Patent [19]

Miller et al.

[11] Patent Number: 4,573,627

[45] Date of Patent: Mar. 4, 1986

[54] INDIUM BUMP HYBRID BONDING METHOD AND SYSTEM

[75] Inventors: Brian S. Miller, Stafford; Aubrey J. Dunn, Springfield, both of Va.

[73] Assignee: The United States of America as represented by the Secretary of the Army, Washington, D.C.

[21] Appl. No.: 684,223

[22] Filed: Dec. 20, 1984

[51] Int. Cl.$^4$ .................. B23K 20/00; B23K 31/02
[52] U.S. Cl. .................. 228/102; 228/180.2; 228/9; 228/12; 228/44.7; 228/49.4
[58] Field of Search ............ 228/102, 180.2, 3.1, 228/9, 10, 12, 44.1 A, 49 R

[56] References Cited

U.S. PATENT DOCUMENTS

| | | | |
|---|---|---|---|
| 3,580,460 | 5/1971 | Lipshutz | 228/3.1 |
| 3,669,333 | 6/1972 | Coucoulas | 228/180.2 |
| 3,698,620 | 10/1972 | Geyer | 228/3.1 |
| 3,871,015 | 3/1975 | Lin | 228/180.2 |
| 3,887,998 | 6/1975 | Hartleroad | 228/180.2 |
| 4,184,623 | 1/1980 | Strasser | 228/180.2 |

Primary Examiner—Nicholas P. Godici
Assistant Examiner—C. McKee
Attorney, Agent, or Firm—Max L. Harwell; Aubrey J. Dunn; Anthony T. Lane

[57] ABSTRACT

In order to ensure total bonding together of two-dimensional arrays of indium bumps on circuit boards, additional bumps are placed on each board in a triangular pattern which contains the array of that board. Opposing sets of thrusters are used to move the boards and their bumps toward each other, after the arrays are aligned with the boards juxtaposed and substantially parallel to each other. As corresponding sets of additional bumps touch each other, the set of thrusters moving the boards at those points hold their positions, until all sets of additional bumps are in touch; all of the thrusters of at least one board are then simultaneously energized until a predetermined pressure is achieved between the boards.

2 Claims, 3 Drawing Figures

INDIUM BUMP HYBRID BONDING METHOD AND SYSTEM

The invention described herein may be manufactured, used, and licensed by the U.S. Government for governmental purposes without the payment of any royalties thereon.

BACKGROUND OF THE INVENTION

This invention is in the field of systems for bonding together integrated circuit boards. In particular, it is concerned with those systems for bonding infrared detector arrays to readout or amplifying devices, such as CCD's (charge couple devices) or multiplexers. One of the common current systems is the so called "indium bump hybrid bonding" wherein indium bumps are deposited both on the array and on the CCD. The bumps are deposited as mirror image patterns on the array and the CCD and are bonded together by pressure after alignment. Unfortunately, it is very difficult to get the bump patterns parallel to each other before applying pressure. This results in unequal pressure distribution on the bump pattern, with the result that some sets of bumps are overcompressed and other sets do not contact. The present invention is able to overcome this problem.

SUMMARY OF THE INVENTION

This invention is an indium bump hybrid bonding method, and a system for performing this method. The method is practiced between two integrated-circuit boards or equivalents wherein it is desired to bond members of an array of bumps on one board to corresponding members of another array on another board, with the vertices of the triangle outside the array. In addition to the arrays of bumps, at least three additional bumps are placed in a triangle on each board. Associated with each of these additional bumps is an energizible pusher or thruster for imparting translational movement of the portion of the circuit board on which each additional bump is located. All pushers are initially energized simultaneously and begin pushing with a stepwise or ramp translation. As contact is made between respective sets of additional bumps, the pushers associated therewith are controlled to halt their translations, but maintain position. When all pushers have been so controlled, they are all simultaneously energized to recommence translating their respective board portions until a predetermined pressure is established between the boards.

DESCRIPTION OF PREFERRED EMBODIMENT

Figure 1:
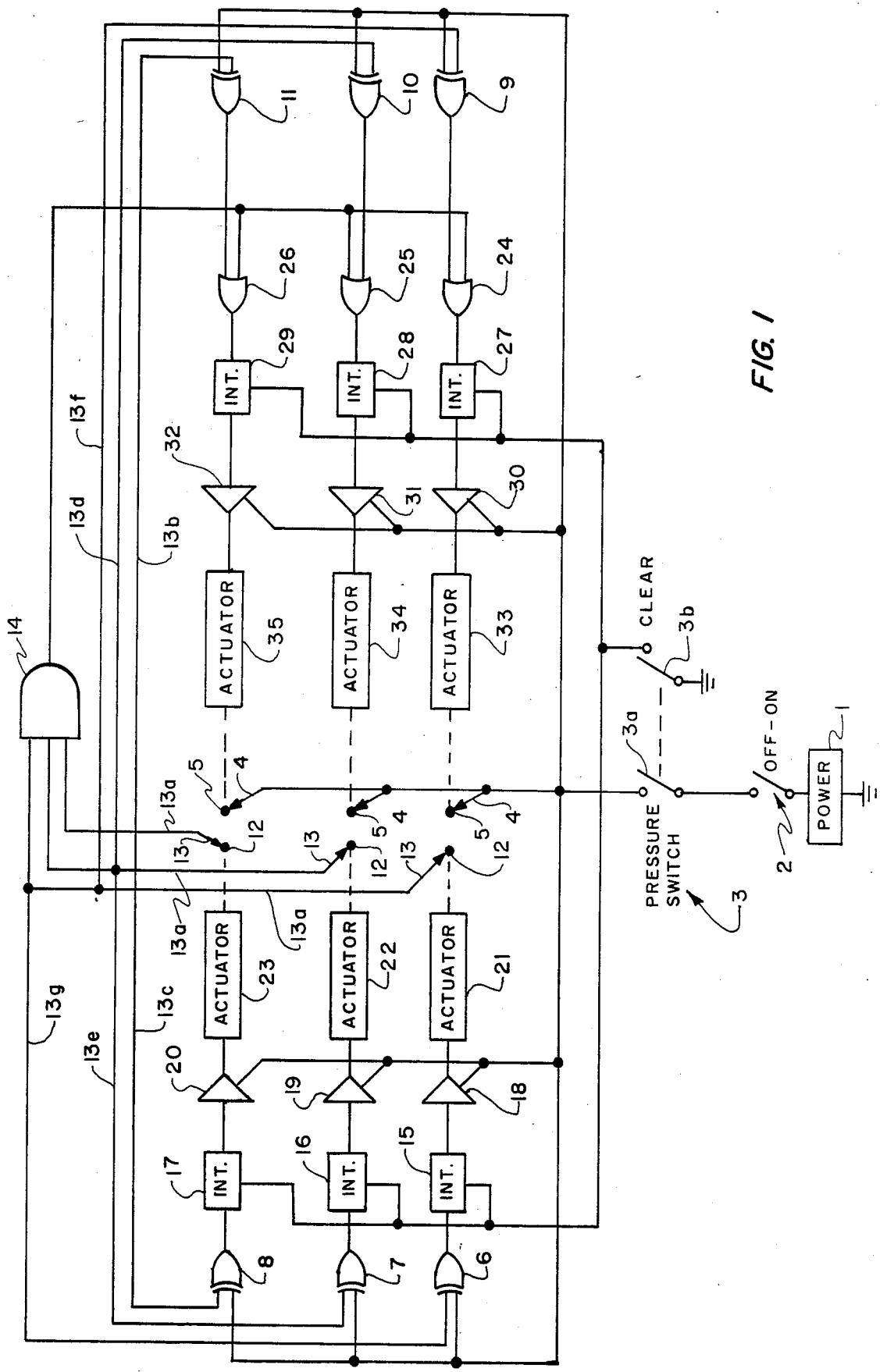
FIG. 1 is a schematic diagram of the electrical portion of the inventive system.

The preferred embodiment of the invention may be best understood when this description is taken in conjunction with the drawings. In FIG. 1, an overall electrical circuit of the invention is shown and includes D-C power source 1, whose power is fed through Off-On switch 2 to pressure switch 3 with normally-closed contact 3a and normally-open contact 3b. From switch 3 power is fed to contacts 4 (which are in contact with indium bumps 5) and as an input to each or exclusive-OR gates 6–11. Indium bumps 5 are carried by an integrated circuit board or equivalent (not shown); adjacent to bumps 5 are additional indium bumps 12 carried by another (not shown) board. All of these bumps 5 and 12 are additional bumps to those bumps (not shown) carried by the circuit boards, and which provide connections between elements on the two boards. In contact with bumps 12 are contacts 13, which feed by conductive lines 13a to inputs of AND gate 14, the output of 14 provides another input to each of OR gates 24–26. Connected to lines 13a are additional lines 13b–18g; 13b and 13c respectively provide other inputs to exclusive OR gates 11 and 8. Lines 13d, 13e, 13f, and 13g respectively provide other inputs to exclusive-OR gates 10,7,9, and 6. The outputs of exclusive-OR gates 6,7, and 8 respectively act as inputs in integrators 15,16, and 17; the outputs of these integrators are signal inputs to amplifiers 18,19, and 20. These amplifiers are fed power from switch 3, their outputs feed actuators 21,22, and 23. Actuators are preferably piezo-electric thrusters which impart translational movements to bumps 12 by pushing against the boards which carry these bumps. The outputs of exclusive-OR gates 9–11 feed as shown to OR gates 24,25, and 26, and these OR gates feed integrators 27,28, and 29. Similar to integrators 21–23, integrators 27–29 feed amplifiers 30,31, and 32, and these amplifiers feed actuators 33,34, and 35; these actuators are the same type as actuators 21–23 and impart translational movements to bumps 5.

OPERATION OF SYSTEM

The system operates as follows: circuit boards (not shown) with corresponding arrays of indium bumps (also not shown) and each with additional indium gates, such as bumps 5 for one board and bumps 12 for the other board, are inserted such that bumps 5 and 12 touch contacts 4 and 13, with the boards approximately parallel, and with the arrays in registration. Switch 2 is then turned on, and power is supplied to amplifiers 18–20 and 30–32 and to one input of each of gates 6–11. These gates turn on, and in the case of gates 9–11, turn on gates 24–26. Gates 24–26 feed power into integrators 27–29 and the integrator outputs begin to rise from zero in a substantially linear manner. These outputs are amplified by amplifiers 30–32, and actuators 33–35 cause translations of bumps 5. At the same time during which these events occur, gates 6–8 are also turned on, and integrators 15–17 and amplifiers 21–23 operate the same as the previously described integrators and amplifiers. Actuators 21–23 thus cause translations of bumps 12. When contact is made between any pair of 5–12 bumps, the actuators causing translations of these bumps cease their translational movements and hold position. For example, when bump 5 and 12 associated with actuators 35 and 23 contact, power is provided on one line and on 13b and 13c to other inputs of gates 8 and 11. These, being exclusive-OR gates, go low on their outputs. Gate 26, fed by the output of 11, also goes to a low output. The outputs of integrators 17 and 29 thus cease increasing, but hold at the value reached when bumps 5 and 12 met. The power on line 13a to gate 14 causes no change in the state of 14. When another pair of 5–12 bumps contact, the same events happens as just described, and another pair of actuators hold at the positions reached when contact is made. When the third pair of 5–12 bumps contact, other things happen: since all three lines 13a feeding AND gate 14 are high, its output goes high and turns on OR gates 24,25, and 26, such that all of the actuators 33,34 and 35 resume their translational movements. When a predetermined pressure is reached between the boards, pressure switch 3 operates: contact 3a opens and interrupts power to bumps 5 and gates 6–11; contact 3b connects to ground and clears all of integrators 21–23 and 27–29. The operation may be summarized as follows: all of actuators 21–23 and 33–35 are simultaneously energized and begin translating their respective bumps 12 and 5 towards each other. As each pair of bumps contact, the actuators associated therewith cease translating and hold their positions. When all bump pairs are in contact, all the actuators of one side are simultaneously energized and continue translating until a predetermined pressure is reached between bumps, at which point all actuators are deenergized.

Figure 2:
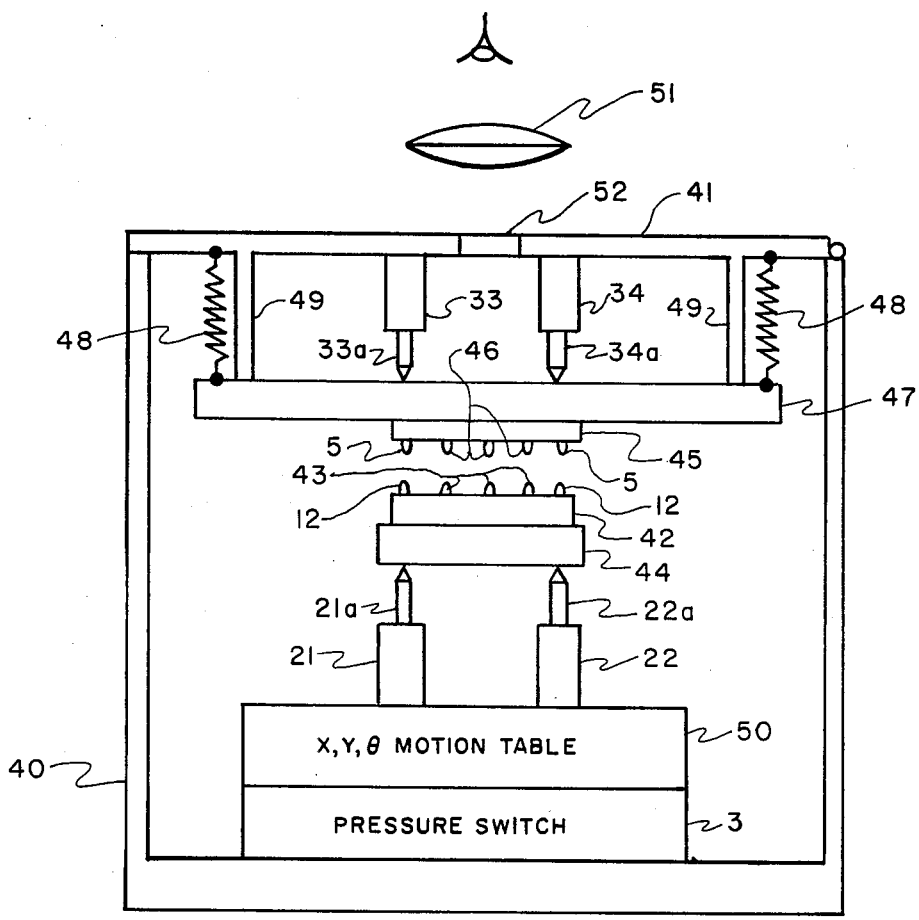
FIG. 2 is a schematic showing of the mechanical portion of the inventive system.
Figure 3:
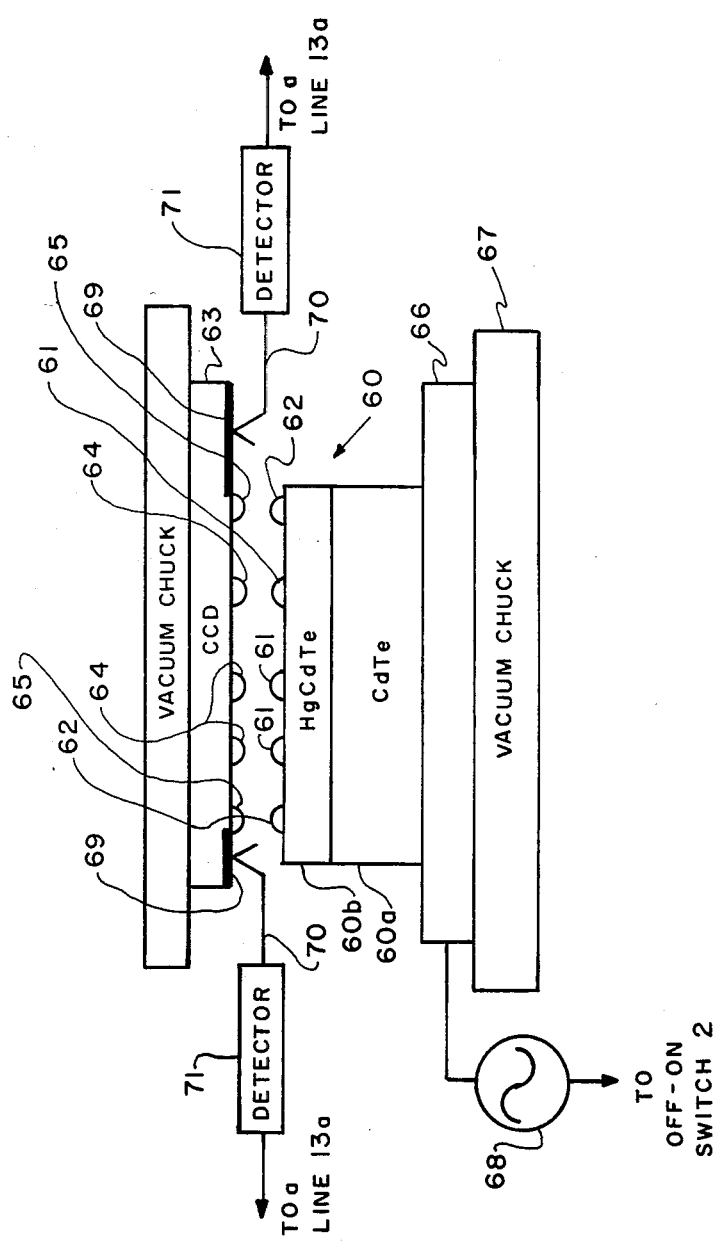
FIG. 3 is a schematic detail view of a portion of FIG. 2.

The mechanical set-up of the invention may be more readily understood by referring to FIGS. 2 and 3. In FIG. 2, we see a mostly schematic side view of a device for practicing the invention. This device includes housing 40 with lid 41 hinged atop 40. In order to bond together indium bumps on circuit boards, lid 41 is opened, and one board 42 with an array of indium bumps 43 and additional bumps 12 (corresponding to bumps 12 of FIG.1) is placed on vacuum chuck 44. The other board 45 with bump array 46 and additional bumps 5 (corresponding to bumps 5 of FIG. 1) is placed on vacuum chuck 47, and lid 41 is closed. Chuck 47 is suspended from springs 48, which hold 47 in contact with posts 49. Chuck 44 is partly supported by probes 21a and 22a of actuators 21 and 22 corresponding to like-numbered actuators in FIG. 1. It should be understood that actuator 23, with a probe corresponding to probes 21a and 22a, also supports chuck 44, but has been omitted for drawing clarity. The actuators are atop x,z, $\theta$ motion table 50, and 50 rests on pressure switch 3 corresponding to switch 3 of FIG. 1. Actuators 33 and 34 have their probes 33a and 34a bearing on chuck 47; these actuators correspond to 33 and 34 of FIG. 1; actuator 35 will also have a probe bearing on chuck 47, but has been omitted for clarity, It should be understood that chucks 44 and 47 may include fixtures thereon to ensure that bumps 5 and 12 are aligned with their respective actuators 33,34 and 21,22. With the board in place, and with the lid closed, motion table 50 is adjusted to bring the bump arrays and additional bumps into registration. This is done by observing a portion of the array with magnifying lens 51 through hole 52 in lid 41. At least a portion of chuck 47 is transparent; board 45 is transparent to the viewing light so that the bump array may be seen therethrough. This registration adjustment between boards is well known in the prior art bonding techniques and is not, per se, a part of the invention; obviously, other registration techniques could be used. When the board arrays are in registration, the tips of probes 21a and 33a and their respective bumps 5 and 12 will be colinear, and parallel to a line through the tips of probes 22a and 34a and their respective bumps 5 and 12 and operation proceeds as set forth in the description of FIG. 1 above, until pressure switch 3 operates. Obviously, at least one of vacuum chucks 44 or 47 must be deenergized at the same time, in the usual manner. Lid 41 is then opened and the bonded boards are removed. Although not shown in FIG. 2, it should be understood that contacts 4 and 13 are touching respective bumps 5 and 12—these contacts may be mounted on chucks 47 and 44.

In the case of bonding between an infrared detector chip and a CCD readout for the chip, one may be working with such small devices that the use of contacts touching additional bumps on the chip is impractical. A way of overcoming this problem is shown in FIG. 3. In this Figure, the detector chip 60 includes a CdTe substrate 60a with a HgCdTe layer 60b thereon delineated into detectors (not shown), and with an array of indium bumps 61 thereon. Additional bumps 62 are also carried on the chip and it is in registration with CCD readout 63. This readout has with an array of indium bumps 64 and additional bumps 65. Chip 60 rests on a conductive layer 66 atop vacuum chuck 67 (corresponding to chuck 44 of FIG. 2). This conductive layer is fed a r-f signal from generator 68 connected to Off-On switch 2. The operation of this device is substantially the same as the FIG. 1–FIG. 2 inventions as described above, but elements 66 and 68 take the place of contacts 4. When Off-On switch 2 is closed, generator 68 imparts r-f energy to layer 66—this energy is coupled through chip 60 to bumps 62. When these bumps contact bumps 65, the r-f appears on edge strips 69 connected to bump 65. In contact with these strips are conductive fingers 70 corresponding to contacts 13 of FIG. 1; bumps 62 and 65 respectively correspond to bumps 5 and 12 of FIG. 1. The r-f from fingers 70 is detected by detectors 71 and d-c signals are passed to lines 13a of FIG. 1 as pairs of contacts 62–65 touch.

Although the actuators of the invention has been shown as being colinear with the additional indium bumps, it should be understood that this may not be the case for a very small device or circuit board. It may be necessary to carry pressure probes on ends of lever arms, with the actuators acting on these arms.

Although it has not been specifically set forth above, it should be obvious that the arrays of indium bumps being bonded are two dimensional, and that the additional bumps are arranged in a triangle on each board, with the array of each board inside this triangle.

We claim:

1. A method of bonding together two arrays of indium bumps on two circuit boards, wherein corresponding additional indium bumps are formed on each board, outside of said arrays, and wherein means is provided to translate said boards toward each other, said means including an energizible actuator corresponding to each of said additional bumps, the method including the steps of:

placing said boards on said means in approximate parallel conjunction;

aligning said boards such that corresponding bumps of said arrays of bumps and said additional bumps are juxtaposed;

energizing said actuators of said means to cause translation of said boards toward each other;

stopping translation of corresponding actuators as corresponding ones of said additional bumps on said two boards come in contact with each other, until all said actuators are stopped;

reenergizing at least those actuators associated with the additional bumps on one of said boards until a predetermined pressure is reached between said boards;

deenergizing and retracting all actuators when said pressure is reached, and;

removing the boards thus bonded from said means.

2. A system for ensuring total area bonding in the indium bumps hybrid bonding technique, wherein it is desired to bond together two two-dimensional arrays of indium bumps or two electrical circuit boards, wherein each board includes at least three additional indium bumps in a triangular pattern including the area of said arrays, wherein said system includes:

means for holding said boards in a substantially parallel and aligned relationship, wherein corresponding bumps of said array of bumps and of said additional bump are juxtaposed with respect to each other;

plural means for translating regions of said means for holding toward each other, wherein said regions correspond to the locations of said additional bumps;

means for energizing said means for translating and for deenergizing respective means of said means for translating as corresponding ones of said additional bumps come into contact, until all said means for translating are deenergized;

means for reenergizing at least all those means for translating associated with one of said boards until a predetermined pressure is achieved between said boards.

* * * * *